(12) United States Patent
Carluccio et al.

(10) Patent No.: US 12,339,316 B2
(45) Date of Patent: Jun. 24, 2025

(54) MASS-PRODUCTION TESTING FOR LAUNCHER-IN-PACKAGE WITH THROUGH-BOARD WAVEGUIDE

(71) Applicant: NXP B.V., Eindhoven (NL)

(72) Inventors: Giorgio Carluccio, Eindhoven (NL); Björn Christian Brands, Rellingen (DE); Henrik Asendorf, Hamburg (DE)

(73) Assignee: NXP B.V., Eindhoven (NL)

( * ) Notice: Subject to any disclaimer, the term of this patent is extended or adjusted under 35 U.S.C. 154(b) by 151 days.

(21) Appl. No.: 18/204,601

(22) Filed: Jun. 1, 2023

(65) Prior Publication Data

US 2024/0402244 A1    Dec. 5, 2024

(51) Int. Cl.
*G01R 31/28* (2006.01)

(52) U.S. Cl.
CPC ..... *G01R 31/2896* (2013.01); *G01R 31/2886* (2013.01)

(58) Field of Classification Search
CPC ............... G01R 33/0047; H01L 33/48; H01L 2933/0033
See application file for complete search history.

(56) References Cited

U.S. PATENT DOCUMENTS

| | | | | |
|---|---|---|---|---|
| 2006/0226848 A1* | 10/2006 | Lai | ..................... | G01R 31/2635 324/501 |
| 2007/0096759 A1* | 5/2007 | Weinraub | ........... | G01R 31/3167 324/756.01 |
| 2021/0239753 A1 | 8/2021 | Zanati et al. | | |
| 2021/0239754 A1 | 8/2021 | Schat et al. | | |

OTHER PUBLICATIONS cohu.com, "xWave Test Contactor/ Probe Head: Broadband Production Solution for cmWave and mmWave up to 100 GHz", downloaded from <<https://www.cohu.com/xwave#/top>> on Jan. 19, 2023; 7 pages.v.

Mroczkowski, Jason et al., "Production Test Interface Solutions for mmWAve and Antenna in Package (AiP)", Chip Scale Review, Jan.-Feb. 2019; pp. 10-13.

Pal, Abhijit et al.; "Compact Transitions for Loopback Testing of Packaged Antennas with Waveguide Launchers"; 2023 53rd European Microwave Conference, (EuMA), European Microwave Association, Sep. 19-21, 2023, Berlin, Germany.

Pal, Abhijit et al.; "Loopback Testing of Automotive 77 GHz Antenna-in-Package Radar Transceiver ICs"; 2022 14th German Microwave Conference (GeMiC), IMA, May 16-18, 2022, Ulm, Germany.

* cited by examiner

*Primary Examiner* — Tung X Nguyen

(57) ABSTRACT

A two-stage test process for testing IC packages having integrated launchers includes a first stage in which an RF-accurate test process is used to perform RF-accurate tests on a sample set of IC packages to obtain RF-accurate test results and a loop-back test process is performed to obtain loop-back test results. Test characterization data is obtained by comparing the RF-accurate test results to the loop-back test results. In a second stage, larger-scale testing is performed solely with the loop-back test process, and the loop-back test results for each tested IC package are compared with the test characterization data to characterize the test operation of the tested IC package. The loop-back test process can employ a test jig employing a PCB-mounted or PCB-integrated loop-back structure for relatively rapid test setup and test processing.

20 Claims, 9 Drawing Sheets

MASS-PRODUCTION TESTING FOR LAUNCHER-IN-PACKAGE WITH THROUGH-BOARD WAVEGUIDE

BACKGROUND

Certain radio frequency (RF) signaling systems benefit from further miniaturization and integration for realizing high-performance and/or low-cost applications. These miniaturization and integration efforts can be facilitated by the use of a launcher-in-package (LiP) solution in which one or more RF launchers are integrated into an integrated circuit (IC) package and the underlying printed circuit board (PCB) on which the IC package is mounted implements channels as air waveguides to wirelessly couple the integrated RF launchers with one or more antennas mounted on the opposing side of the PCB.

Conventional approaches for testing RF devices employing external PCB-based launchers typically require measurements for a coupled RF signal from the transmitter to the one or more launchers and separate measurements for a signal entering the receiver from the one or more launchers. These measurements are performed using vectorial network analyzers (VNAs), power meters, and external signal generators, which typically results in high testing costs, especially for multisite high-volume mass production validation at millimeter-wave (mmWave) and higher frequencies. Moreover, the conventional process for automating RF device testing includes selection of a device under test (DUT) from a reel, tape, or tray and manual placement of the selected DUT into a relatively-compact chamber. However, such a test environment often is impracticable for testing LiP-based devices using conventional RF testing approaches given the difficulty of providing precise connections between the inputs/outputs (I/Os) of an IC package implementing LiP and the probes of the VNAs, external signal generators, and other external test equipment in the testing chamber.

SUMMARY OF EMBODIMENTS

The systems and methods described in the following may be better understood by considering the following examples, individually or in any of a variety of combinations:

Example 1: A test jig for testing an integrated circuit (IC) package having a first launcher and a second launcher, the test jig including: a socket configured to receive contacts of the IC package at a first surface and having a first air channel extending between the first surface and an opposing second surface of the socket at a first location corresponding to a location of the first launcher and a second air channel extending between the first surface and the second surface at a second location corresponding to a location of the second launcher; a printed circuit board (PCB) having a third surface on which the socket is mounted and an opposing fourth surface, and further having a third air channel aligned with the first air channel of the socket and a fourth air channel aligned with the second air channel of the socket; and a loop-back structure having a loop-back channel extending from the third air channel to the fourth air channel and configured to convey radio frequency (RF) signaling emitted by the first launcher through the first air channel and third air channel to the second launcher through the fourth air channel and the second air channel.

Example 2: The test jig of Example 1, wherein the loop-back structure includes a structure separate from the PCB and disposed at the fourth surface of the PCB, the structure including: a first opening at a fifth surface facing the fourth surface and aligned with an opening of the third air channel at the fourth surface of the PCB; and a second opening at the fifth surface and aligned with an opening of the fourth air channel at the fourth surface of the PCB.

Example 3: The test jig of Example 2, wherein the structure further includes: one or more air channels extending between the first opening and the second opening.

Example 4: The test jig of Example 3, wherein the loop-back structure further includes an RF absorbent material in at least one of the one or more air channels.

Example 5: The test jig of Example 2, wherein the loop-back structure further includes: an RF coupler mounted at a sixth surface of the structure opposite the fifth surface, the RF coupler having a third opening and a fourth opening and operating to modify at least one of an amplitude or phase of signaling propagated by the RF coupler; and wherein the structure further includes a fifth channel extending from the first opening to an opening at the sixth surface aligned with the third opening and a sixth channel extending from the second opening to an opening at the sixth surface aligned with the fourth opening.

Example 6: The test jig of Example 1, wherein the loop-back structure is integrated in the PCB using metallizations of the PCB.

Example 7: The test jig of Example 6, wherein the loop-back structure includes at least one of: a substrate integrated waveguide (SIW); a micro-strip transmission line; or a strip-line.

Example 8: The test jig of Example 1, wherein the socket further includes conductive structures to couple contacts of the IC package to corresponding contacts at the third surface of the PCB.

Example 9: A test system including the test jig of Example 8, further including: test equipment coupled to the IC package via the PCB and the socket, the test equipment configured to test the IC package by controlling transmission circuitry of the IC package to output RF signaling via the first launcher and to capture representations of the RF signaling received by the second launcher via the loop-back channel of the loop-back structure.

Example 10: A method of operating the test system of Example 9, the method including: operating the test equipment to control the transmission circuitry of the IC package to output the RF signaling; and operating the test equipment to capture the representation of the RF signaling received by the second launcher via the loop-back structure.

Example 11: A method of operating the test jig of Example 1, the method including: operating transmission circuitry of the IC package to output RF signaling via the first launcher; and operating transmission circuitry of the IC package to capture a representation of the RF signaling received by the second launcher via the loop-back structure.

Example 12: A method for testing an integrated circuit (IC) package integrating at least a first launcher and a second launcher by a first set of test equipment via a test jig, the method including: performing a loop-back test by: controlling transmitter circuitry of the IC package to output RF signaling from the first launcher; propagating the RF signaling to the second launcher via a propagation path of the test jig, the propagation path including a loop-back structure connected to the first launcher via a first air channel through a socket of the test jig and a second air channel in a printed circuit board (PCB) of the test jig that is aligned with the first air channel, and connected to the second launcher via a third air channel through the socket and a fourth air channel in the PCB that is aligned with the second air channel; and controlling receiver circuitry of the IC package to process a representation of the propagated RF signaling received at the second launcher to generate test results.

Example 13: The method of Example 12, further including: receiving the test results from the IC package at the first set of test equipment; and characterizing, at the first set of test equipment, an operational status of the IC package based on a comparison of the test results to a test characterization data set.

Example 14: The method of Example 13, further including: testing a plurality of instances of the IC package using the test jig and the first set of test equipment to generate a first data set; testing the plurality of instances of the IC package using a different test jig and a second set of test equipment to generate a second data set; and determining the test characterization data set based on identified correlations between the first data set and the second data set.

Example 15: The method of Example 13, wherein receiving the test results includes: receiving signaling from the receiver circuitry at the first set of test equipment via the socket and at least one signal path in the PCB.

Example 16: The method of Example 12, wherein controlling the transmitter circuitry includes: transmitting control signaling from the first set of test equipment to at least one contact of the IC package via the socket and at least one signal path in the PCB, wherein the transmitter circuitry is configured to output the RF signaling in response to the control signaling.

Example 17: The method of Example 12, wherein the loop-back structure includes a structure disposed on a side of the PCB opposite the socket, the structure including a first opening aligned with a facing opening of the second air channel in the PCB, a second opening aligned with a facing opening of the fourth air channel in the PCB, and one or more air channels extending between the first opening and the second opening.

Example 18: The method of Example 12, wherein the loop-back structure includes a structure disposed on a side of the PCB opposite the socket, the structure including a first opening aligned with a facing opening of the second air channel in the PCB, a second opening aligned with a facing opening of the fourth air channel in the PCB, and further includes an RF attenuator mounted at a surface of the structure opposite the PCB, the RF attenuator having a third opening connected to the first opening via an air channel in the structure and a fourth opening connected to the second opening via a different air channel in the structure.

Example 19: The method of Example 12, wherein the loop-back structure is integrated in the PCB using metallizations of the PCB and includes at least one of: a substrate integrated waveguide (SIW); a micro-strip transmission line; or a strip-line.

Example 20: An IC package tested using the method of Example 12.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
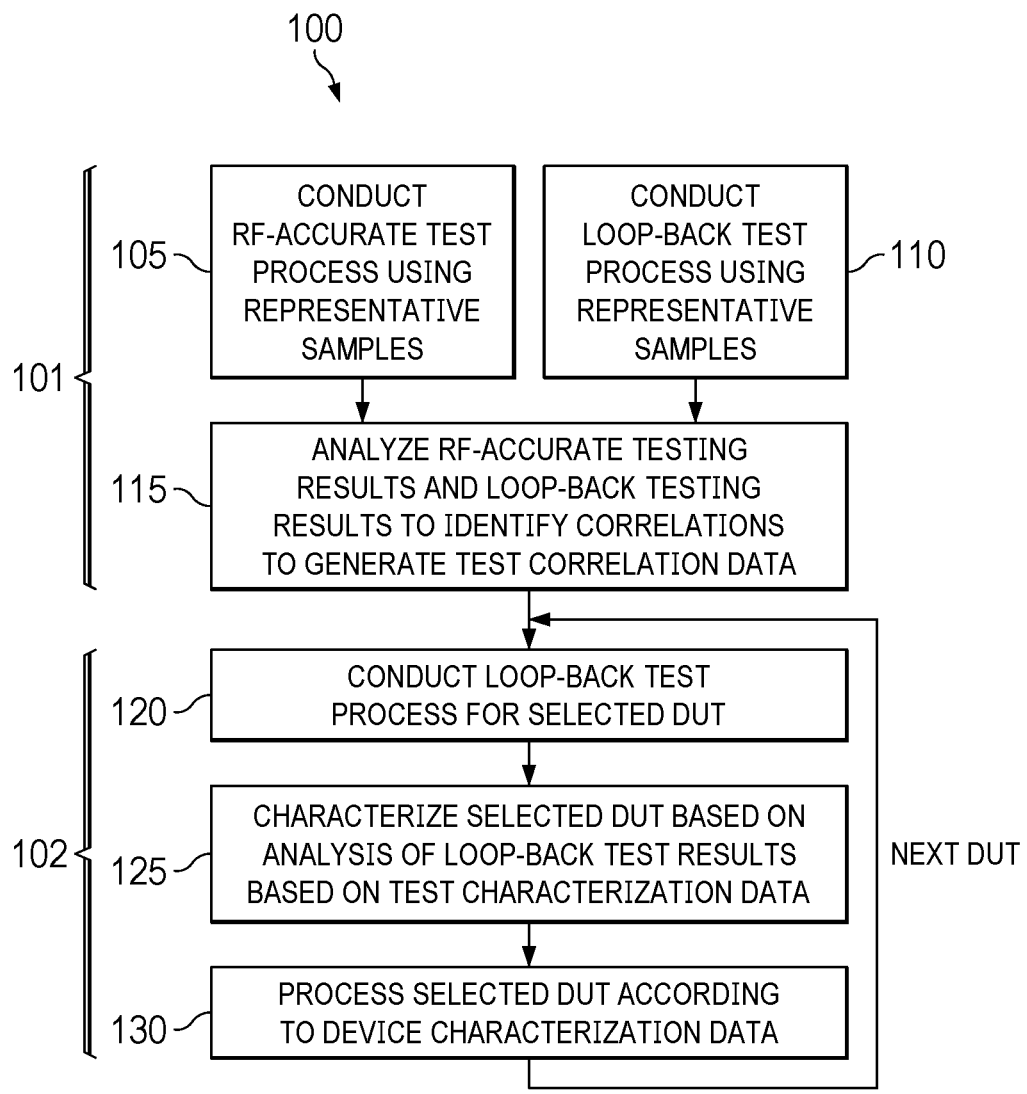
FIG. 1 is a diagram illustrating a two-stage test process for larger scale testing of IC packages utilizing integrated launchers in accordance with some embodiments.

Conventional testing schemes for IC packages with integrated launchers (e.g., Launcher-in-Package, or LiP) are costly and relatively inefficient for mass production testing, customer acceptance testing, or other larger-scale testing as they require expensive, sensitive testing equipment and complex connectivity between the device under test (DUT) and the testing equipment, and often in a test environment with limited space. This is particularly so for IC packages operating at mmWave RF frequencies (30 gigahertz (GHz)) and higher), such as for certain radar implementations. FIGS. 1-8 illustrate embodiments of a two-stage test process for testing LiP-based IC packages and corresponding test jigs to facilitate the specific test stages. The first stage of testing is employed on a relatively small sample set of DUTs (that is, instances of an IC package to be tested) to develop a test characterization data set that reflects how test results from a more-accurate or more-detailed testing process correlate to test results for the same DUT from a less-accurate or less-detailed testing process. The second stage then utilizes the same less-accurate/less-detailed testing process on a larger scale, such as mass production testing, but with reference to the test characterization data set to extrapolate a more precise understanding of the tested operation of the DUT than would be available from the less-accurate/less-detailed testing process alone.

In implementations, the less-accurate/less-detailed test process (hereinafter, "the loop-back test process") requires less time and effort for testing each DUT as well as requiring a less expensive and complex set of test equipment than the more-accurate/more-detailed testing process (hereinafter, "the RF-accurate test process"). For example, the RF-accurate test process may employ different test equipment and require a more involved test set-up and test conduction process. To illustrate, the RF-accurate test process may utilize an external signal generator and a specialized testing chamber in order to test one or more launcher pairs at their expected operating RF frequencies when employed in the field, with this external signal generator and specialized test chamber requiring relatively extensive manual set up for connecting the test equipment to the DUT and positioning the DUT so connected into the test chamber. As such, while the RF-accurate test is suited for accurate testing of the launcher pair and associated circuitry of the DUT at expected operational frequencies (that is, for RF-accurate testing), the RF-accurate test often is impracticable for mass production testing and other larger-scale testing from a time, effort, and cost perspective. Conversely, as described in greater detail below, the loop-back test process may employ a set of testing equipment and a test jig that allow for rapid test set up and rapid testing of a DUT, and thus be suitable for larger-scale testing. However, to facilitate this rapid set-up and testing, the loop-back test process may omit certain test equipment that requires a more complex connection, more complex handling, a more complex test jig set-up, or a combination thereof, and thus may not be suitable for testing a DUT at the expected operating frequencies of the device in the field (that is, is not RF-accurate testing by itself). However, by obtaining the test characterization data set from testing a smaller sample of DUTs using both the RF-accurate test process and the loop-back test process and determining correlations between the test results of these two tests, the loop-back test then may be applied to a larger sample set, which may include all devices under consideration, while omitting the RF-accurate test, and the test results from this loop-back test then may be compared to the test characterization data to extrapolate the likely operational characteristics of the DUT at the expected operational frequencies without requiring explicit testing of the DUT at those expected frequencies.

Efficient mass production testing and other larger scale testing relies, in part, on the use of a test jig that facilitates rapid, reliable connection of a DUT to corresponding test equipment, consistent performance, and either ease of use by a human operator or is readily adaptable to automated testing mechanisms. Accordingly, the following also describes implementations of a test jig for use by the loop-back test process and which provides one or more of these benefits. In some embodiments, the test jig implements a printed circuit board (PCB) (or other substrate) with a DUT socket mounted on a first side of the PCB. The DUT socket is configured to connect mechanically and electrically to a DUT and to the PCB. The DUT socket further includes through-channels (that is, air waveguides) that extend through the DUT socket and which are aligned with the locations of the integrated launchers of the DUT that are to be involved in the testing process. For each launcher pair to be tested, the test jig further includes a loop-back structure at an opposing second side of the PCB and two air waveguide channels in the PCB, one channel to connect one end of the loop-back structure to the through channel in the DUT socket aligned with a first launcher of the launcher pair and another channel to connect the other end of the loop-back structure to the through channel in the DUT socket that is aligned with the second launcher of the launcher pair. Thus, the two associated channels in the DUT socket, the two corresponding channels in the PCB, and the corresponding loop-back structure together form a waveguide-based transmission path for RF signaling generated by transmitter circuitry of the DUT and emitted by the first launcher and received by the second launcher via the transmission path and processed by receiver circuitry of the DUT to generate test results that represent or characterize the operation of the transmitter circuitry, the receiver circuitry, and the first and second launchers. As described below, this loop-back structure may be implemented as a separate structure disposed at the second surface of the PCB, or as an integrated metallization structure, such as a substrate integrated waveguide (SIW), at one or more metallization layers of the PCB, such as those proximate to the second surface.

Note that in the following, certain orientational terms, such as top, bottom, front, back, lateral, vertical, above, below, and the like, are used in a relative sense to describe the positional relationship of various components. These terms are used with reference to the relative position of components either as shown in the corresponding figure or as used by convention in the art and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure. Further, note that certain positional terms, such as co-planar or parallel, will be understood to be interpreted in the context of fabrication tolerances or industry standards. For example, co-planar shall be understood to mean co-planar within applicable tolerances as a result of one or more fabrication processes affecting the components indicated to be co-planar, or co-planar within a tolerance utilized in the appropriate industry or fabrication technology. Moreover, it will be appreciated that for simplicity and clarity of illustration, components shown in the figures have not necessarily been drawn to scale. For example, the dimensions of some of the components may be exaggerated relative to other components in order to facilitate understanding of associated aspects.

FIG. 1 illustrates a method for a two-stage test process 100 of launcher pairs and associated circuitry of each IC package of a plurality of IC packages with one or more integrated launcher pairs in accordance with some embodiments. The two-stage test process includes a first stage 101 in which testing is performed on a sample set of instances of an IC package (hereinafter, devices under test or DUTs) to generate a test characterization data set and then a second stage 102 in which testing is performed on a larger scale of DUTs and in which the operation of each DUT is characterized based on a comparison or evaluation of the test results of the DUT from the second stage 102 with the test characterization data set from the first stage 101.

The first stage 101 of the two-stage test process 100 comprises two separate test processes performed on the same DUTs from a sample set of DUTs. A first test process 105 is performed for each DUT of the sample set of DUTs and comprises a test process in which the DUT is mounted on a first test jig and connected to a first set of test equipment that is configured to operate the DUT, via the first test jig, at expected operational frequencies to be employed by the DUT when in the field for purposes of testing one or more pairs of integrated launchers and related circuitry. As such, the first set of test equipment may include various external devices, such as an external signal generator capable of generating timing signals at the expected operational frequencies, a vectorial network analyzer (VNA), a power meter, and the like. Such devices are connected to the integrated circuits and integrated launchers of a DUT via the first test jig and operate to obtain measurements of during test operation of the DUT at the expected operational frequencies, such as by characterizing waveguide transitions through measurements of scattering parameters via measurements of a coupled RF signal from transmitter circuitry of the DUT and separate measurements of the coupled signal entering the receiver circuitry via a corresponding pair of integrated launchers. As the first test process 105 is capable of measuring waveguide transitions at RF frequencies expected to be employed by the device in the field, the first test process 105 is referred to herein as the "RF-accurate test process 105." The test results of performance of the RF-accurate test process 105 on a DUT, referred to herein as "RF-accurate test results", are stored in a database or other storage component of a computer system (e.g., part of test equipment 220, FIG. 2A) for subsequent access and analysis, as described herein.

The first stage 101 also includes a second test process 110 that also is performed for each DUT of the sample set of DUTs and comprises a test process in which the DUT is mounted on a second test jig and connected to a second set of test equipment that is configured to operate the DUT, via the second test jig, for purposes of testing one or more pairs of integrated launchers and their corresponding circuitry. The second set of test equipment, in at least one embodiment, does not include certain RF-qualified test equipment, such as the aforementioned VNA, power meter, and/or external signal generator, and as a result the second test process 110 typically is not configured to perform testing at RF frequencies expected to be employed by the device in the field; that is, the second test process 110 does not, by itself, accurately test the operation of a pair of integrated launchers and corresponding circuitry at expected field operational RF frequencies. Instead, as described below, the second test jig used in the second test process 110 includes a loop-back structure that feeds RF signaling generated by transmitter circuitry and one launcher of a launcher pair to the other launcher of the launcher pair and corresponding receiver circuitry, and the output provided by the receiver circuitry is output to a computing system for storage as part of the test results of the DUT from the second test process 110. As such, the second test process 110 is referred to herein as the "loop-back test process 110" and the test results for a DUT from the loop-back test process 110 are referred to herein as "loop-back test results."

The RF-accurate test process 105 provides RF-accurate testing of a DUT but in embodiments requires expensive test equipment and relatively slow test set up (e.g., connection of the probes of such equipment to the first test jig) and relatively long test duration times, and thus is impracticable for larger-scale testing. Conversely, in embodiments the loop-back test process 110 does not require certain expensive test equipment and allows for relatively fast test set-up and relatively short test duration times, and thus is suitable for larger-scale testing, but the loop-back test process 110, by itself, does not facilitate RF-accurate characterization of the operation of the DUT. In at least one embodiment, the two-stage test process 100 leverages the benefits of both the RF-accurate test process 105 and the loop-back test process 110 while mitigating downsides of each of these test processes by performing an analysis process 115 in which the RF-accurate test results for each DUT obtained from the RF-accurate test process 105 and the loop-back test results for the DUT obtained from the loop-back test process 110 are compared or otherwise analyzed to identify correlations, and this analysis is performed for the RF-accurate test result set/loop-back test result set for each DUT from the sample set in order to identify data correlations between the RF-accurate test results and loop-back test results. That is, the analysis process 115 seeks to identify data correlations that identify how a given test value from a loop-back test result correlates to a corresponding test value in a RF-accurate test result; i.e., how a test value from a loop-back test result reflects a corresponding RF-related operational parameter of the corresponding launcher pair and associated circuitry of a DUT.

For example, during the loop-back test process 110, a phase-modulated signal is propagated from the transmitting launcher to the receiving launcher, passing through the loop-back test jig. At the receiver circuitry of the DUT, the signal is demodulated. The magnitude and/or phase associated with the demodulated dominant harmonics are measured. This modulation and demodulation of the RF signal is, for example, useful for testing full-duplex radar systems to avoid electrically long delay lines necessary to mimic the radar RF channel. The magnitude and/or phase of the measured signal is compared against measurements of a fully-characterized and properly working sample, thus obtaining a feedback on the performance of the DUT. In particular, some electrical performance parameters of the combinations of different transmitters, receivers, and relevant launchers can be validated. Differences among the parameters of working samples against the ones of damaged samples can be related to failures within the integrated circuitry of the DUT, failures in the launcher feedlines (such as shorts or open circuits), etc. That is, in this correlation process the key RF parameters of a larger number of DUTs measured with the loop-back test process 110 are compared to a considerably smaller number of DUTs measured with the RF-accurate test process. Both the larger number and smaller number of DUT test results have a value distribution based on their individual inaccuracies of the corresponding test systems (e.g., the internal sensor for the loop-back test process 110 typically has a much higher inaccuracy than a VNA that is likely employed in the RF-accurate test process 105, and from this the mean values of the loop-back tested DUTs and the mean values of the RF-accurate tested DUTs should match within their respective margins of error. From this a look up table (or other set of one or more data structures) can be generated and which contains values to correct the loop-back test results to match the mean value of the RF-accurate test results. In this way, the RF accurate test values can be projected to the loop-back test results, as well as the test limits that are based on the specifications of the DUT.

With the correlations between test results from the RF-accurate testing process 105 and the test results from the loop-back testing process 110 identified and represented in the test correlation data, the two-stage test process 100 enters the second stage 102 in which larger scale testing of a larger set of instances of the IC package are tested. For example, the sample set of the first stage 101 may be on the order of tens, hundreds, or thousands of instances of the IC package, whereas the larger-scale testing of the second stage 102 may be on the order of thousands, tens of thousands, hundreds of thousands, millions, or more. Because of set-up time, testing time, and equipment expense, it is impracticable to utilize the RF-accurate test process 105 or equivalent RF-accurate process during larger-scale testing. Accordingly, as described below the second stage 102 utilizes the same or similar loop-back test process and the test characterization data to characterize the RF operation of a DUT without having to incur the expense and effort of performing an RF-accurate test process for each DUT in larger-scale testing.

Thus, for a selected DUT from the larger-scale set, the DUT is mounted to the loop-back test jig and a loop-back test process 120 is performed on the DUT using the loopback test jig to obtain loop-back test results for the selected DUT. The loop-back test process 120 is the same as, or similar to, the loop-back test process 110 performed during the first stage 101. The loop-back test results are output from the DUT via the loop-back test jig to a computing system, whereupon the loop-back test results are temporarily or permanently stored. At characterization process 125, the same computing system or different computing system accesses the loop-back test results for the selected DUT and analyzes the loop-back test results in view of the test characterization data obtained at test process 120 so as to characterize the RF-related operation of one or more launcher pairs and associated circuitry of the selected DUT. For example, this analysis can include identifying a test value from the loop-back test results and accessing a LUT, database, or other data structure representing the test characterization data so as to identify a corresponding RF-accurate operational characterization of the DUT, as described above. This process is repeated for each launcher pair and related circuitry of interest as represented in the loop-back test results, and the resulting analysis generates a device characterization data set representing the one or more device operation characterizations determined from the characterization process 125.

With the DUT so characterized, a computer system and/or a human operator perform an evaluation process 130 in which the device characterization data set is evaluated to determine how to further process the DUT. For example, the device characterization data set may reveal that the DUT is not operating within specified parameters (e.g., has failed one or more of the intended tests), and thus the DUT is disqualified for further processing, use, or sale, or the device characterization data may reveal that the DUT is operating within specified parameters (e.g., has passed all intended tests), and thus is suitable for further processing, use, or sale. As another example, the device characterization data set may serve to bin the DUT into one of a plurality of performance level bins for further processing, use, or sale. The second stage 102 then may be repeated for the next DUT to be selected during larger-scale testing.

Figure 2A:
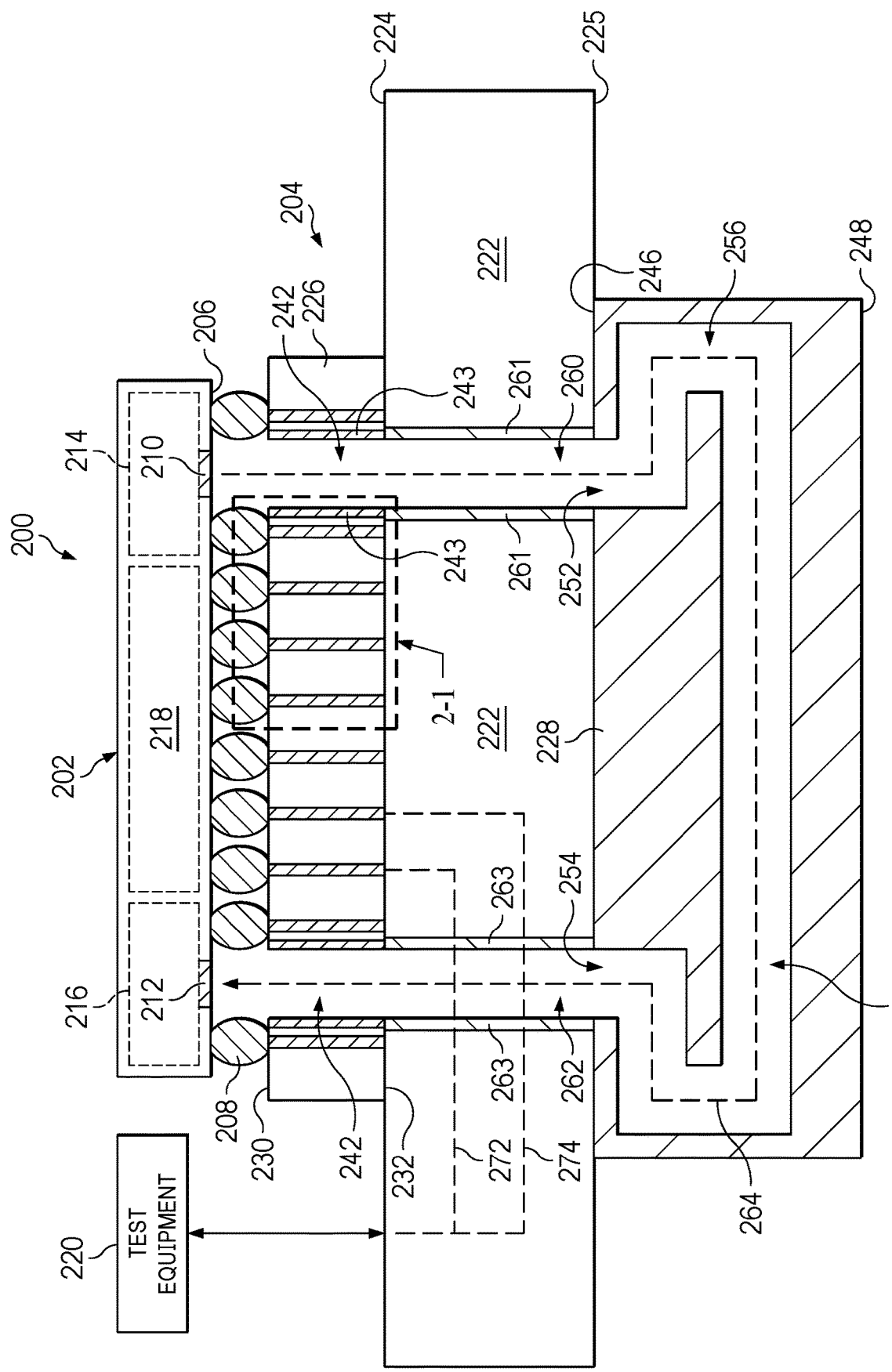
FIG. 2A is a diagram illustrating a cross-section view of a loop-back test jig for use in performing loop-back testing for the two-stage test process of FIG. 1 in accordance with some embodiments.
Figure 2B:
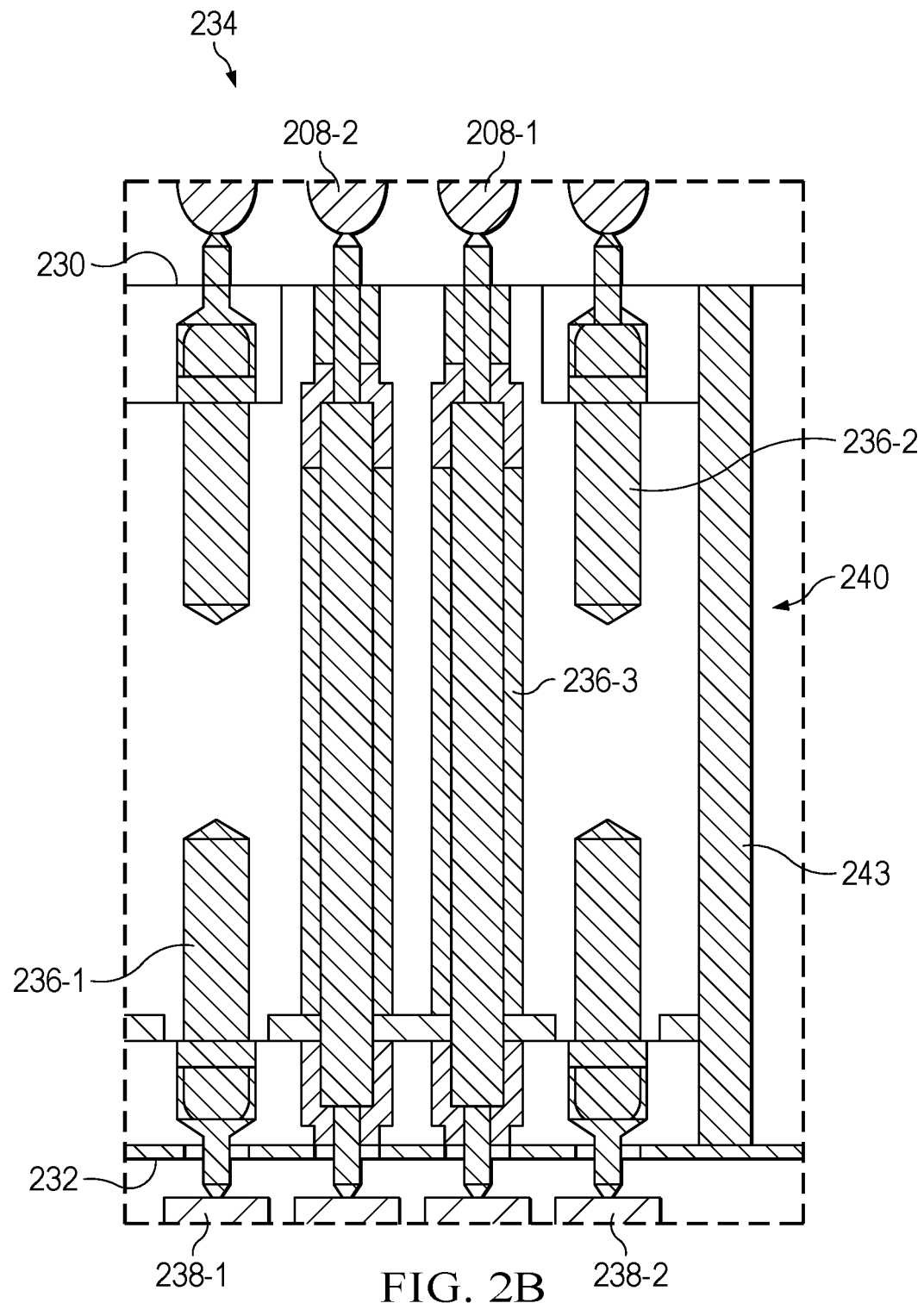
FIG. 2B is a diagram illustrating an enlarged view of a portion of the cross-section view of the loop-back test jig of FIG. 2A in accordance with some embodiments.

FIG. 2A illustrates a cross-section view 200 of an IC package 202 mounted on a loop-back test jig 204 in accordance with some embodiments. The IC package 202 represents an instance of an IC package that employs one or more pairs of integrated launchers (e.g., LiPs) and associated circuitry and which is tested as a DUT in accordance with the one or more of the test processes 105, 110, or 120 described above. The IC package 202 includes a mounting surface 206 at which a plurality of package contacts 208 (e.g., pins, ball grid array (BGA) contacts, etc.) are disposed. The IC package 202 further includes one or more pairs of integrated launchers disposed at, or proximate to, the mounting surface 206 (that is, the "bottom" of the IC package 202), such as the illustrated pair of launchers 210 and 212. As shown, the mounting surface 206 is devoid of package contacts 208 in regions surrounding the launchers 210 and 212 so as to avoid interfering with the operations of these launchers.

The IC package 202 further includes associated RF circuitry for each launcher, such as RF circuitry 214 for the launcher 210 and RF circuitry 216 for the launcher 212, wherein the RF circuitry is configured to manipulate the associated launcher to transmit RF signaling representative of an input signal (e.g., operate as transmitter circuitry), manipulate the associated launcher to receive RF signaling and then to process the received RF signaling (e.g., via modulation or demodulation) to generate an output signal (e.g., operate as receiver circuitry), or both (e.g., operate a transceiver circuitry). For purposes of the following discussion, it is assumed that the launcher 210 operates a transmitter launcher and thus the RF circuitry 214 operates as transmitter circuitry and further that the launcher 212 operates a receiver launcher and thus the RF circuitry 216 operates as receiver circuitry, but in the event that the RF circuitries 214 and 216 are transceiver circuitries, then the roles may be reversed for a second-pass of transmit/receive testing. The IC package 202 further may include additional integrated circuitry 218 for controlling the overall operation of the IC package 202, including controlling the operation of the RF circuitries 214 and 216, as well as providing input signals to one or both of the RF circuitries 214 or 216 and receiving output signals from one or both of the RF circuitries 214 or 216 for processing. Further, the integrated circuitry 218, in one embodiment, operates to interface with test equipment 220 via the loop-back test jig 204 so as to receive test commands from the test equipment 220 for implementation via the RF circuitries 214 and 216 and the pair of launchers 210 and 212, as well as to output test result data obtained as a result of execution of these test commands to the test equipment 220.

The loop-back test jig 204 represents an implementation of the loop-back test jig that is employed for one or both of the loop-back test processes 110 and 120. The loop-back test jig 204 includes a PCB 222 or having a surface 224 and an opposing surface 225. A DUT socket 226 is mounted at the surface 224 of the PCB 222 and a loop-back structure 228 is mounted at the opposing surface 225 of the PCB 222. The DUT socket 226 has a surface 230 facing the IC package 202 and an opposing surface 232 facing the PCB 222. At the surface 230, the DUT socket 226 includes mounting contacts for providing electrical coupling to corresponding package contracts 208 of the IC package 202 and at surface 232, the DUT socket 226 includes mounting contacts for providing electrical coupling to corresponding contacts of at the surface 224 of the PCB 222. These mounting contacts of the DUT socket 226 operate to distribute power and ground to the corresponding package contacts 208 as well as to provide signaling pathways between the IC package 202 and the PCB 222. For example, as illustrated by enlarged view 234 of FIG. 2B, the DUT socket 226 can include a mounting contact 236-1 (in the form of, for example, a spring-loaded pin) to electrically connect to a contact 238-1 of the PCB 222 for receiving a power supply voltage and a mounting contact 236-2 to electrically connect to a package contact 208-1 to distribute the power supply voltage to the package contact 208-1. As another example, the DUT socket 226 can include a mounting contact 236-3 that extends through the DUT socket 226 so as to provide a signal pathway between a contact 238-2 of the PCB 222 and a package contact 208-2 of the IC package 202. The DUT socket 226 further may include any of a variety of fastening mechanisms (omitted for clarity) to mechanically affix the IC package 202 to the DUT socket 226, such as clamps, screws or other fasteners, springs, friction fastening, and the like.

To facilitate propagation of RF signaling between pairs of launchers being tested, for each launcher being tested the DUT socket 226 further includes a through-channel 240 extending between the surfaces 230 and 232 and at a location that is aligned with the location of the corresponding launcher when the IC package 202 is mounted in the DUT socket 226, with each through-channel acting as an air waveguide through the DUT socket 226 for RF signaling. As shown, these include a through-channel 240 at a location aligned with the location of the launcher 210 and a through-channel 242 at a location aligned with the location of the launcher 212. In implementation, the body of the DUT socket 226 is primarily composed of plastic or some other electrically-insulative material, or combination thereof. As such, to facilitate propagation of RF signaling through the through-channel 240, the walls of each through-channel 240 are plated, coated, or otherwise lined with a metal lining (e.g., metal lining 243 for through-channel 240) composed of one or more metals, metal alloys, or other conductive materials, or combinations thereof. For example, a film of gold (Au), silver (Ag), aluminum (Al), copper (Cu), or combinations or alloys thereof, may be deposited of the walls of each through-channel 240 via deposition process, a growth process, a lamination process, or a combination thereof.

The loop-back structure 228 is mounted opposing the DUT socket 226 at the surface 225 of the PCB 222 and comprises a surface 246 facing the surface 225 of the PCB 222 and an opposing surface 248. For each launcher pair to be tested, the loop-back structure 228 provides a loop-back channel for facilitating propagation of RF signaling between the launcher pairs. Accordingly, the loop-back channel for a launcher pair is composed of a pair of openings at the surface 246, each opening of the pair corresponding to one of the launchers of the launcher pair, and one or more air channels connecting the two openings. To illustrate, for the pair of launchers 210 and 212, the loop-back structure 228 includes a loop-back channel 250 having openings 252 and 254, respectively, and at least one air channel 256 (air waveguide) extending between, and connecting, the openings 252 and 254. Although a single air channel 256 is shown in the depicted cross-section view 200, in implementations the loop-back channel 250 may employ multiple air channels to connect the openings 250 and 250. Moreover, note that while a relatively simple shape and path for the air channel 256 is depicted in FIG. 2A for ease of illustration, the one or more air channels of a loop-back channel may employ any of a variety of shapes with varying complexity.

As a loop-back channel serves to propagate RF signaling between a corresponding pair of launchers of the IC package 202, the walls of the loop-back channel typically are metal lined or otherwise electrically conductive to provide shielding, decrease resistance loss, and otherwise facilitate propagation of RF signaling. Accordingly, in some embodiments, the loop-back structure 228 is composed primarily of one or a combination of metals, metal alloys, or other conductive materials, and the walls of the loop-back structure 228 may be composed of the same material as the body of the loop-back structure 228 or they may be coated or otherwise lined with a different metal/metal alloy/conductive material composition. To illustrate, the body of the loop-back structure 228 may be composed multiple layers of brass, copper, or aluminum staked together via a clamp, pins, adhesives, screws, etc., with each layer milled or cast to provide the loop-back channel(s), with the walls of the loop-back channel(s) composed of the same material as the body or coated or lined with, for example, gold or silver via a deposition, growth, or lamination process. In other embodiments, the body loop-back structure 228 may composed of one or more layers of plastic, carbon-fiber, or other non-conductive materials that are likewise staked together and each layer milled or cast to provide a corresponding portion of the loop-back channel(s), with the walls of the loop-back channel(s) coated or lined with an appropriate conductive material as similarly described above with respect to the through-channels of the DUT socket 226.

To form a complete loop-back RF transmission path between a launcher pair of the IC package 202 through the DUT socket 226, the PCB 222, and the corresponding loop-back channel of the loop-back structure 228, the PCB 222 includes a pair of through-channels extending from the surface 224 facing the DUT socket 226 to the surface 225 facing the loop-back structure 228. One through-channel of the pair is aligned with a corresponding through-channel in the DUT socket 226 that in turn is aligned with one launcher of the launcher pair. This through-channel further is aligned with a corresponding opening of the loop-back channel in the loop-back structure 228 so that the through-channel in the DUT socket 226 and the opening in the loop-back channel are connected via the through-channel in the PCB 222. The other through-channel of the pair in the PCB 222 is aligned with the corresponding through-channel in the DUT socket that is aligned with the other launcher of the launcher pair, and likewise serves to connect the corresponding through-channel of the DUT socket 226 to the corresponding opening of the loop-back channel in the loop-back structure 228. To provide shielding, decrease resistance loss, and otherwise facilitate propagation of this RF signaling though the PCB 222, the walls of these through-channels may be coated or otherwise lined with one or a combination of metals, metal alloys, or other conductive materials using any of a variety of processes, including a growth process, a deposition process, a lamination process, and the like. The conductive material(s) employed in the lining of the walls of these through-channels may be the same as or different from the conductive material(s) employed for the walls of the through-channels in the DUT socket 226.

To illustrate, for the pair of launchers 210 and 212, the PCB 222 includes a through-channel 260 aligned with, and extending between, the through-channel 240 of the DUT socket 226 and the opening 252 of the loop-back channel 250 and having a metal lining 261, and further includes a through-channel 262 aligned with, and extending between, the through-channel 242 of the DUT socket 226 and the opening 254 of the loop-back channel 250 and having a metal lining 263. As such, the through-channel 240 of the DUT socket 226, the through-channel 260 of the PCB 222, the loop-back channel 250 of the loop-back structure 228, the through-channel 262 of the PCB 222, and the through-channel 242 of the DUT socket 226 together form a complete loop-back RF transmission path 264 for RF signaling transmitted via the launcher 210 and received via the launcher 212, or alternatively, for RF signaling transmitted via the launcher 212 and received via the launcher 210.

Figure 3:
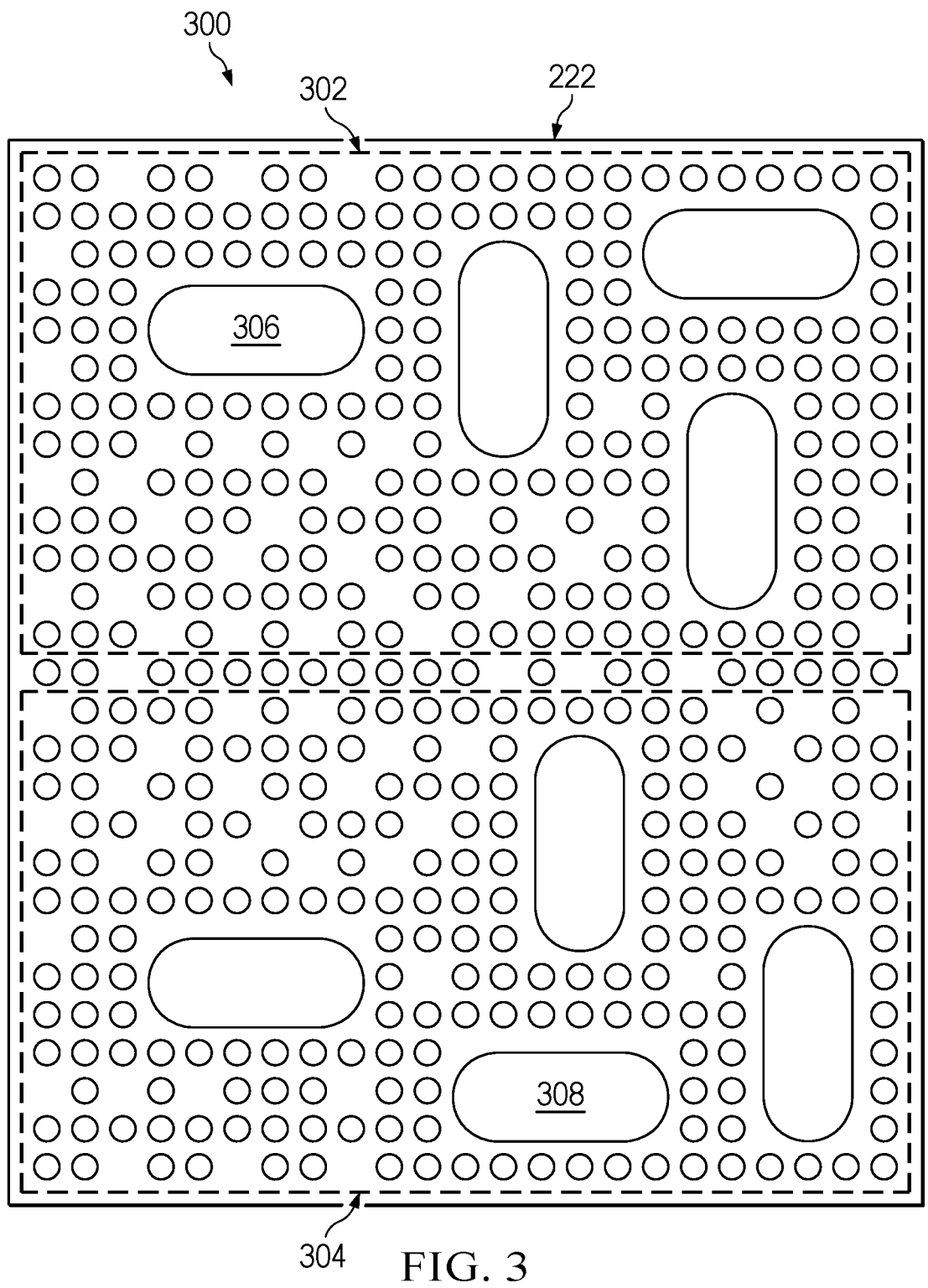
FIG. 3 is a diagram illustrating a view of a mounting surface of a PCB of the loop-back testing jig that employs stadium-shaped air channels in accordance with some embodiments.
Figure 4:
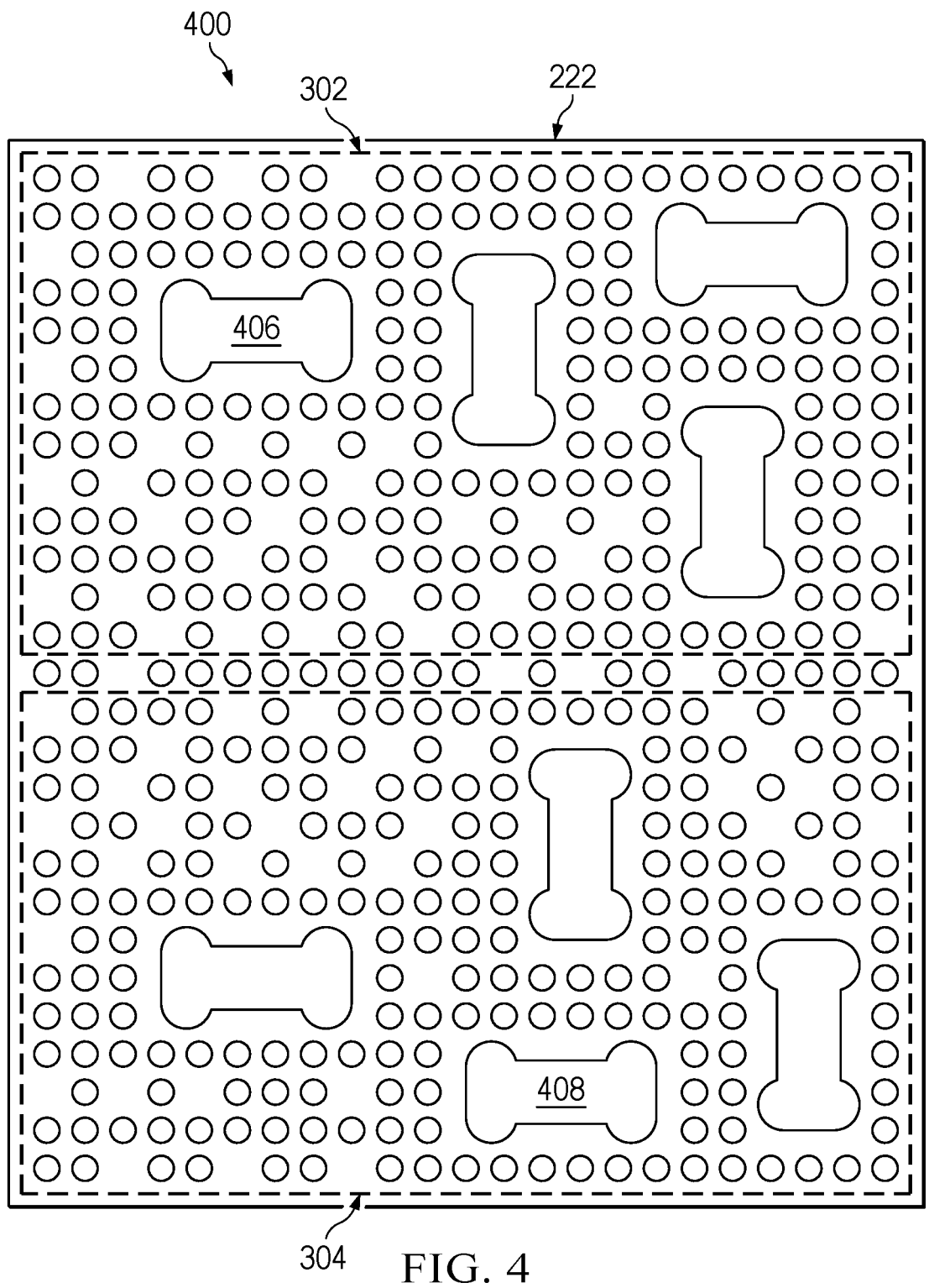
FIG. 4 is a diagram illustrating a view of a mounting surface of a PCB of the loop-back testing jig that employs dog bone-shaped air channels in accordance with some embodiments.
Figure 5:
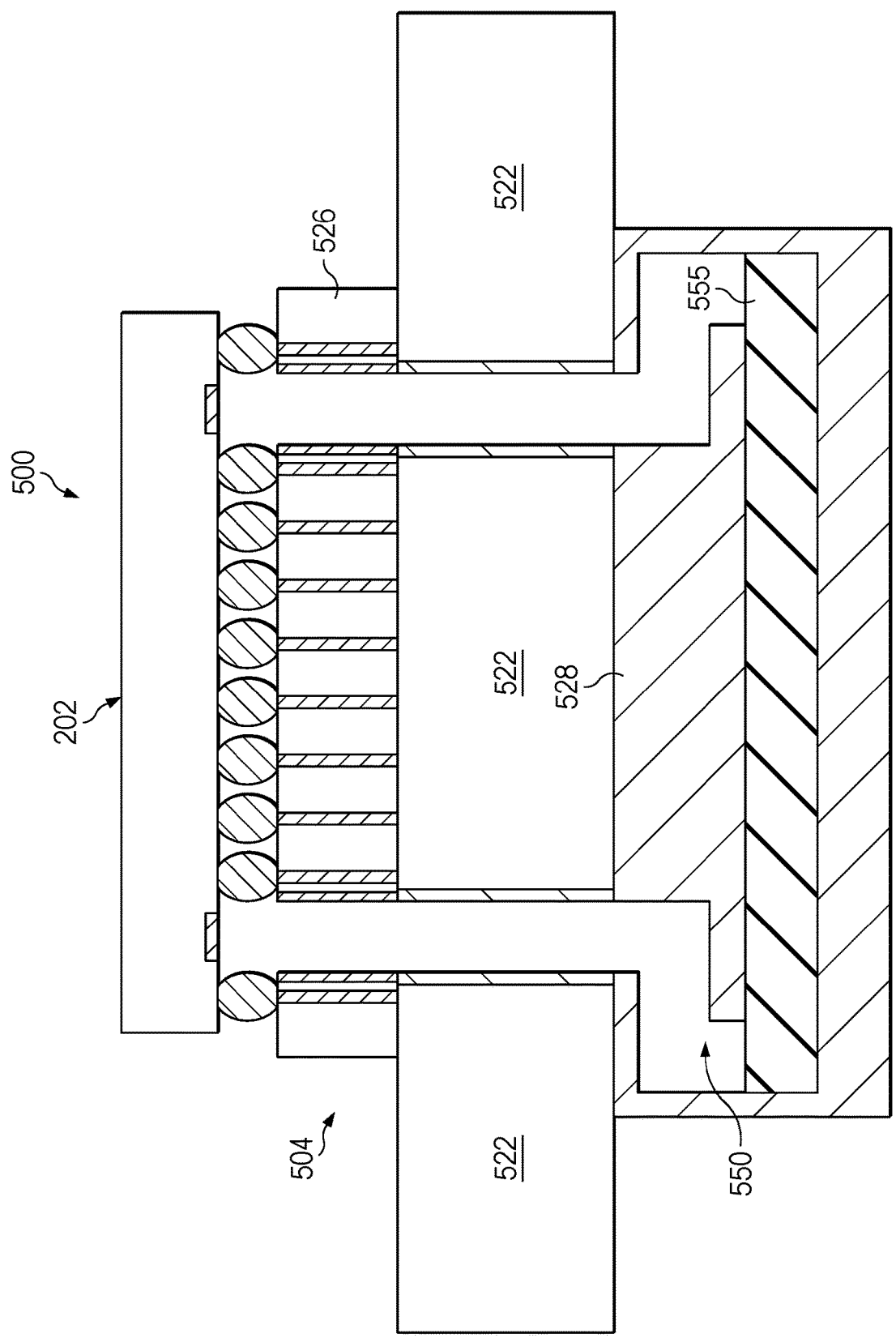
FIG. 5 is a diagram illustrating a cross-section view of a loop-back test jig employing an RF absorber in a loop-back structure in accordance with some embodiments.

Any of a variety of cross-sectional shapes may be employed for the through-channels in the DUT socket 226, the through-channels in the PCB 222, and the loop-back channel(s) in the loop-back structure 228. Typically, the cross-sectional shape is relatively consistent along the corresponding complete loop-back RF transmission path formed therefrom, and the cross-section shape employed is selected to present a suitable electromagnetic dispersive behavior compatible with the behavior of the pair of launchers being tested. To illustrate, FIGS. 3 and 4 illustrate top views 300 and 400, respectively, of corresponding example implementations of the PCB 222. As illustrated by the top views 300 and 400, in these examples the loop-back test jig 204 supports testing of four launcher pairs, and thus the PCB 222 has eight through-channels. The PCB 222 is organized into two regions: a transmit (TX) region 302 and a receive (RX) region 304. The TX region 302 contains the four openings (e.g., opening 306 of FIG. 3 and opening 308 of FIG. 4) of the four through-channels in the PCB 222 for the transmit-side of the loop-back RF transmission paths and the RX region 304 contains the four openings (e.g., openings 308 of FIG. 3 and opening 408 of FIG. 4) of the receive-side of the loop-back RF transmission paths. As illustrated by the openings 306 and 308 of FIG. 3, the cross-sections of these through-channels can a rectangular shape with curved corners (that is, a stadium shape), and the through-channels of the DUT socket 226 and the loop-back channels of the loop-back structure 228 likewise can have a stadium-shaped cross-section. Alternatively, as illustrated by the openings 406 and 408 of FIG. 4, the cross-section of these through-channels, as well as of the through-channels in the DUT socket 226 and the loop-back channels of the loop-back structure 228, can instead have a dog-bone, or barbell, shaped cross-section. While two example cross-section shapes have been described, other cross-section shapes may be employed depending on the particular RF transmission characteristics of the operation of the pair of launchers being tested, such as using cross-sections that match the electromagnetic dispersive behavior of the pair of launchers being tested.

Returning again to FIG. 2A, the use of the loop-back test jig 204 during the loop-back test process 110/120 for testing the operation of the pair of launchers 210 and 212 and associated circuitry 214 and 216 will be described. During test set-up, the IC package 202 is mounted to the DUT socket 226 and the test equipment is connected to the PCB 222 via one or more sockets or other connectors. Power is supplied to the IC package 202 via the DUT socket 226 and the PCB 222, and signaling is transmitted between the IC package 202 and the test equipment 220 via the mounting contacts 236 of the DUT socket 226 and signaling pathways (e.g., signaling pathways 272 and 274) formed via traces, vias, and other metallizations in the PCB 222. The test equipment send control signaling to the IC package 202 via the loop-back test jig 204, in response to which the circuitry 218 controls the transmitter circuitry 214 to emit RF signaling via the launcher 210. In some embodiments, the frequency range of the RF signaling is below the expected operational RF frequency range of the IC package 202 in the field. The emitted RF signaling is propagated along the loop-back RF transmission path 264 through the DUT socket 226 and PCB 222 to the loop-back structure 228 and then back up through the PCB 222 and DUT socket 226 to the launcher 212. The receiver circuitry 216 processes the received RF signaling to generate a corresponding digital signal, which the circuitry 218 then processes (e.g., filters, formats, packetizes, etc.) and then outputs the resulting data as loop-back test results to the test equipment 220 for storage and analysis as described above. For example, in some embodiments the test RF signaling includes controlling the launcher 210 to emit a phase-modulated signal that is propagated along the loop-back RF transmission path 264, and the resulting RF signaling received at the launcher 212 is demodulated, and the magnitude and/or phase associated with the demodulate dominant harmonics is measured and provided as part of the loop-back test results for the launcher pair.

It will be appreciated that due to the relatively short distance of the loop-back RF transmission path provided by the loop-back test jig 204, the RF signaling generated during testing may have an amplitude sufficient to saturate the receiving circuitry, which not only leads to inaccurate testing of the DUT, but also could damage the DUT. Accordingly, the loop-back test jig used for the loop-back test process 110/120 can employ various approaches to efficiently mitigate potential saturation. To illustrate, referring to FIG. 5, a loop-back test jig 504 employing RF absorption is shown in accordance with some embodiments. The loop-back test jig 504 is a variation of the loop-back test jig 204 of FIG. 2A, and thus includes a DUT socket 526, a PCB 522, and loop-back structure 528 which are the same as, or similar to, the DUT socket 226, PCT 222, and loop-back structure 228, respectively, of FIG. 2A. However, to address potential RF saturation, the loop-back structure 528 further implements RF absorption material 555 disposed in a loop-back channel 550 (representing, for example, the loop-back channel 250 of FIG. 2A) that forms part of a loop-back RF transmission path between corresponding launchers of the IC package 202 mounted in the DUT socket 526. The RF absorption material 555 may partially or fully occupy the cross-section of the loop-back channel 550 for a portion or entirety of its length, and may be composed of any of a variety of suitable RF absorption materials (that is, RF lossy materials) or combinations thereof, such as polyurethane foam loaded with carbon (C), rubber, neoprene, silicone, resin, and the like.

Figure 6:
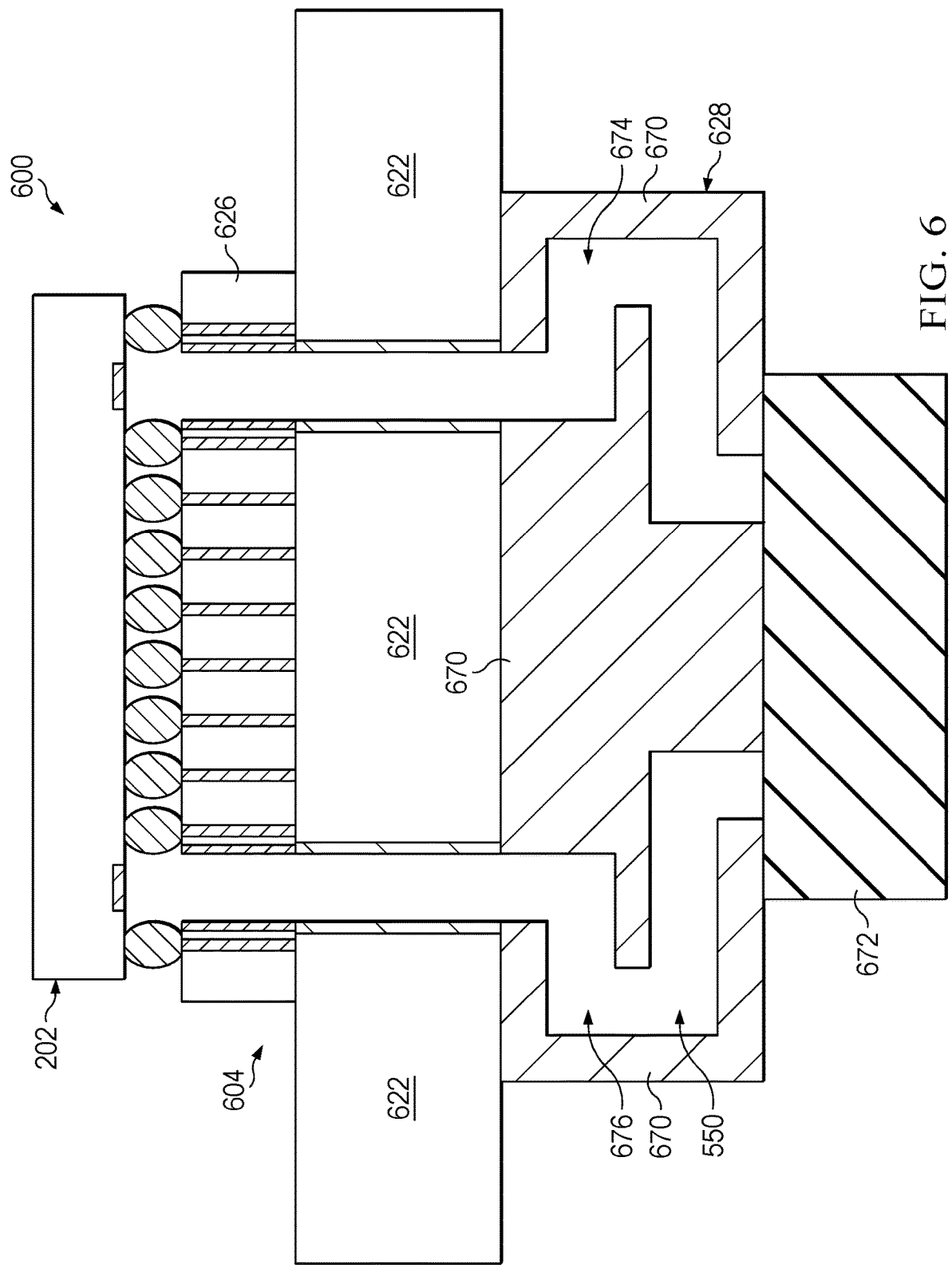
FIG. 6 is a diagram illustrating a cross-section view of a loop-back test jig employing an RF coupler in accordance with some embodiments.

As another example of providing for RF saturation mitigation, FIG. 6 illustrates a cross-section view 600 of another version of a loop-back test jig 604 that may be employed for the loop-back testing process 110/120 in accordance with some embodiments. As with the loop-back test jig 204 of FIG. 2A, the loop-back test jig 604 includes a DUT socket 626 to receive the IC package 202, a PCB 622 upon which the DUT socket 626 is mounted, and a loop-back structure 628 to provide a loop-back channel 650 between a transmit channel formed by a sequence of through-channels through the DUT socket 626 and the PCB 622 and a receive channel formed by a sequence of through channels through the PCB 622 and the DUT socket 626. However, as shown, the loop-back structure 628 is composed of a structure body 670 on which an RF coupler 672 is mounted. The structure body 670 includes a transmit channel 674 connecting a transmit channel formed in the DUT socket 626 and the PCB 622 to the RF coupler 672 and a receive channel 676 connecting the RF coupler 672 to a receive channel formed in the PCB 622 and the DUT socket 626. The structure body 670 may be composed of one or more metals, metal alloys, or combination thereof or composed of plastic, carbon-fiber, or other non-conductive material with the walls of the channels 674 and 676 metalized to facilitate RF signal propagation to and from the RF coupler 672. The RF coupler 672 can comprise one or more structures that operate to attenuate RF signaling received via the channel 674 (that is, to tune or otherwise modify at least one or both of the amplitude or the phase of the RF signaling), with the resulting modified RF signaling output via the channel 676. The RF coupler 672 may comprise, for example: any of, or a combination of, a variety of air waveguide RF couplers, including commercially-available RF attenuators or custom-fabricated RF attenuators, a RF coupling structure that provides for intended lossy coupling, such as a multi-hole directional coupler or a coupler with dimensions that are selected to have low transmission, thereby effectively operating as an attenuator, and the like.

Figure 7:
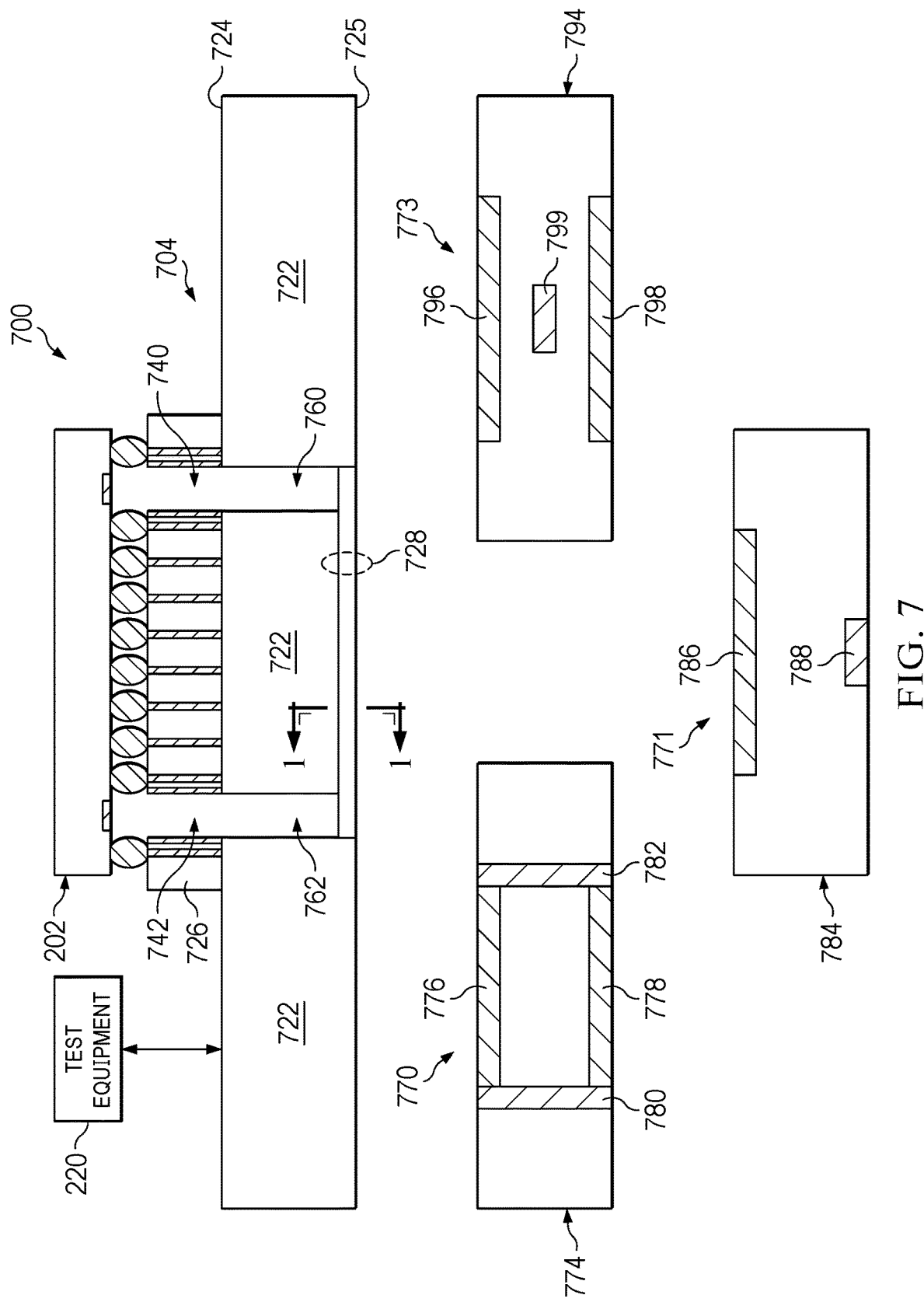
FIG. 7 is a diagram illustrating a cross-section view of a loop-back test jig that integrates a loop-back structure into a PCB of the loop-back test jig in accordance with some embodiments.

Although FIGS. 2-6 illustrate example implementations of a loop-back test jig in which the loop-back channel(s) for looping RF signaling from the transmitter to the receivers in the IC package being tested are implemented in a structure separate from the PCB of the test jib, in other embodiments the loop-back channel(s) can instead be integrated into the PCB of the test jig itself. To illustrate, FIG. 7 depicts a cross-section view 700 of a loop-back test jig 704 for use in the loop-back test process 110/120 and which utilizes integrated loop-back channels in accordance with some embodiments. As shown, the loop-back test jig 704 includes a DUT socket 726 mounted on a surface 724 of a PCB 722. The DUT socket 726 is configured in the same or similar manner as the DUT socket 226 of FIG. 2A, and thus includes mounting contacts to provide power to the instance of the IC package 202 being tested and to provide signaling pathways between the test equipment 220 and the contacts of the IC package 202 via conductive paths formed in via metallizations in the PCB 722. Further, as with DUT socket 226, the DUT socket 726 includes pairs of through-channels extending between the opposing major surfaces, each through-channel at a location that is aligned with a location of a launcher of a corresponding pair of launchers of the IC package being tested and configured to facilitate propagation of RF signaling to/from the corresponding launcher. For example, the DUT socket 726 includes a through-channel 740 aligned with, and providing propagation access to, the launcher 210 of the IC package 202, and further includes a through-channel 742 aligned with, and providing propagation access to, the launcher 212 of the IC package 202. As similarly described above, the DUT socket 226 may be composed of one or more milled or cast layers of metal, metal alloy, or other conductive material or combination thereof, or composed of one or more milled or cast layers of plastic or other non-conductive material with metallized channel walls.

Similar to the PCB 222 of test jig 204, the PCB 722 of loop-back test jig 704 includes, for each through-channel in the DUT socket 726, a corresponding metallized channel aligned with the through-channel in the DUT socket 726 and extending from the surface 724 toward an opposing surface 725 of the PCB 722. For example, for the through-channels 740 and 742 of the DUT socket 726, the PCB 722 includes a metallized channel 760 aligned with, and having a cross-section compatible with, the through-channel 740 and further includes a metallized channel 762 aligned with, and having a cross-section compatible with, the through-channel 742. However, rather than being through-channels as with PCB 222, the channels 760 and 762 do not extend completely to the opposing surface 725, but rather extend to a loop-back structure 728 that is integrated into the PCB 722 proximate to, for example, the surface 725. Thus, rather than utilize a separate structure for providing one or more loop-back channels between a pair of launchers being tested, the PCB 722 integrates the loop-back structure 728 to provides for one or more loop-back channels for the pair of launchers. To this end, the loop-back structure 728 comprises one or more transmission lines formed via metallizations that extend laterally through the PCB 722 between the channel 760 and the channel 762, with such metallizations including metal traces, vias, and the like.

As one example, as shown by cross-section view 770 of the loop-back structure 728 at cut line 1-1, a loop-back channel of the loop-back structure 728 can be implemented in the PCB 722 as a substrate-integrated waveguide (SIW) 774 that is formed via an upper metal layer 776 and a lower metal layer 778 separated by the dielectric material of the PCB 722 and edged by two rows 780, 782 of vias spaced suitably for the wavelength of the test RF signaling. As another example, as shown by alternative cross-section view 771 of the loop-back structure 728 at cut line 1-1, a loop-back channel of the loop-back structure 728 may be implemented in the PCB 722 as a micro-strip waveguide 784 composed of a wider upper metal layer 786 and a narrower lower metal layer 788 separated by the dielectric material of the PCB 722. As yet another example, as shown by another alternative cross-section view 773 of the loop-back structure 728 at cut line 1-1, a loop-back channel of the loop-back structure 728 may be implemented in the PCB 722 as a strip-line waveguide 794 composed of a wider upper metal layer 796 and a wider lower metal layer 798 and a narrower metal layer 799 disposed therebetween and insulated from the metal layers 796 and 798 by the dielectric material of the PCB 722.

Figure 8:
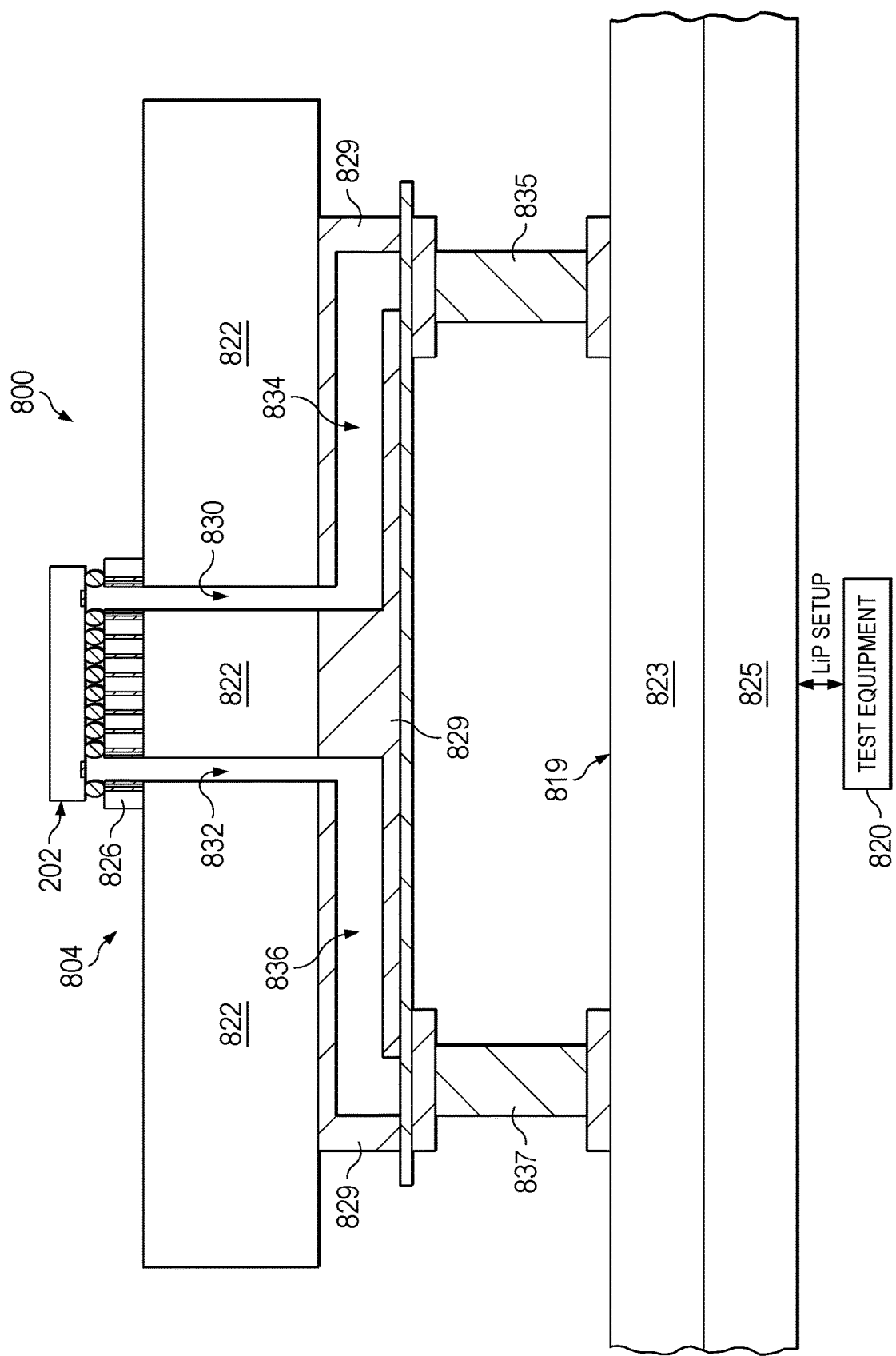
FIG. 8 is a diagram illustrating a cross-section view of a test jig for use in RF-accurate testing in the two-stage test process of FIG. 1 in accordance with some embodiments.

As described above, the RF-accurate test process 105 also utilizes a test jig. However, unlike the loop-back test process 110/120, the RF-accurate test process 105 utilizes specialized external test equipment for facilitating RF-accurate testing of DUT, and thus the test jig typically needs to facilitate higher-frequency RF testing, with such testing utilizing techniques other than loop-back testing. FIG. 8 illustrates a cross-section 800 of a test jig 804 that can be employed for the RF-accurate test process 105 in accordance with at least one embodiment. The test jig 804 includes a PCB 822 having a first surface 824 on which a DUT socket 826 is mounted and an opposing second surface 825 on which a fan-out structure 829 is mounted. The DUT socket 826 includes mounting contacts to connect the contacts of an instance of the IC package 202 to power sources and to signal paths in the PCB 822 that in turn are connected to external test equipment. Further, the DUT socket 826 and the PCB 822 have metalized through-channels that are aligned with launcher to be tested and used to provide propagation paths between the launchers and the fan-out structure 828. For example, for the pair of launchers 210, 212 of the IC package 202, the DUT socket 826 and PCB 822 may have through-channels aligned with the other and the launcher 210 to form a propagation path 830 through the DUT socket 826 and the PCB 822, and the DUT socket 826 and the PCB 822 also may have additional through-channels aligned with the other and the launcher 212 for form a propagation path 832 through the DUT socket 826 and the PCB 822.

Unlike the loop-back structures of the loop-back test rigs which serve to propagate RF signaling generated by one launcher for receipt by another launcher of the IC package 202, the fan-out structure 829 includes fan-out channels to provide propagation paths between the through-channels of the PCB 822 and test probes of a jig interface 819. For example, the fan-out structure 829 includes a fan-out channel 834 to connect the propagation path 830 to a spring-loaded test probe 835 and further includes a fan-out channel 836 to connect the propagation path 832 to a spring-loaded test probe 837.

In addition to the test probes (e.g., test probes 835 and 837), the jig interface 819 includes one or more components for facilitating interfacing between the test jig 804 and external test equipment 820. For example, the test probes may be connected to a testhead 825 (e.g., an Advantest v930000 test platform) and a testhead interface 823, which operates to, for example, upscale tester-sourced signals from the testhead 825 (e.g., to mmW frequencies) as well as downscale the DUT-generated signals for processing by the testhead 825. Moreover, the testhead interface 823 can implement a combiner/splitter unit to enable testing of most or all transmitter/receiver channels in parallel, as well as act as the interface to a pick-and-place unit or other handler.

To illustrate the operation of the test jig 804 with respect to the pair of launchers 210, 212, an instance of the IC package 202 is mounted to the DUT socket 826 and the external test equipment 820 is connected to the PCB 822 and to the jig interface 819. The test equipment 820 manipulates the IC package 802 to emit test RF signaling from the launcher 210, with the test RF signaling having one or more frequencies within an expected operational frequency range of the IC package 202 when in the field (e.g., mmWave frequencies for a radar implementation). The emitted RF signaling is propagated to the test probe 835 via the propagation path 830 is routed to the test probe 835 via the fan-out channel 834. The test RF signal is incoupled and processed by the jig interface 819, whereupon the testhead interface 823 downscales the received signals and a test program running on the test equipment 820 captures the measured signals and the resulting values can be analyzed and compared to the DUT specification resulting in a pass/fail decision and/or binning decision. Moreover, for the loop-back test process, post-processing can be applied based on the correlation process in order to project the RF-accurate results from the captured test data.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A test jig for testing an integrated circuit (IC) package having a first launcher and a second launcher, the test jig comprising:
   a socket configured to receive contacts of the IC package at a first surface and having a first air channel extending between the first surface and an opposing second surface of the socket at a first location corresponding to a location of the first launcher and a second air channel extending between the first surface and the opposing second surface at a second location corresponding to a location of the second launcher;
   a printed circuit board (PCB) having a third surface on which the socket is mounted and an opposing fourth surface, and further having a third air channel aligned with the first air channel of the socket and a fourth air channel aligned with the second air channel of the socket; and
   a loop-back structure having a loop-back channel extending from the third air channel to the fourth air channel and configured to convey radio frequency (RF) signaling emitted by the first launcher through the first air channel and third air channel to the second launcher through the fourth air channel and the second air channel.

2. The test jig of claim 1, wherein the loop-back structure comprises a structure separate from the PCB and disposed at the opposing fourth surface of the PCB, the structure comprising:
   a first opening at a fifth surface facing the fourth surface and aligned with an opening of the third air channel at the fourth surface of the PCB; and
   a second opening at the fifth surface and aligned with an opening of the fourth air channel at the fourth surface of the PCB.

3. The test jig of claim 2, wherein the structure further comprises:
   one or more air channels extending between the first opening and the second opening.

4. The test jig of claim 3, wherein the loop-back structure further comprises an RF absorbent material in at least one of the one or more air channels.

5. The test jig of claim 2, wherein the loop-back structure further comprises:
   an RF coupler mounted at a sixth surface of the structure opposite the fifth surface, the RF coupler having a third opening and a fourth opening and operating to modify at least one of an amplitude or phase of signaling propagated by the RF coupler; and
   wherein the structure further comprises a fifth channel extending from the first opening to an opening at the sixth surface aligned with the third opening and a sixth channel extending from the second opening to an opening at the sixth surface aligned with the fourth opening.

6. The test jig of claim 1, wherein the loop-back structure is integrated in the PCB using metallizations of the PCB.

7. The test jig of claim 6, wherein the loop-back structure comprises at least one of: a substrate integrated waveguide (SIW); a micro-strip transmission line; or a strip-line.

8. The test jig of claim 1, wherein the socket further comprises conductive structures to couple contacts of the IC package to corresponding contacts at the third surface of the PCB.

9. A test system comprising the test jig of claim 8, further comprising:
   test equipment coupled to the IC package via the PCB and the socket, the test equipment configured to test the IC package by controlling transmission circuitry of the IC package to output RF signaling via the first launcher and to capture representations of the RF signaling received by the second launcher via the loop-back channel of the loop-back structure.

10. A method of operating the test system of claim 9, the method comprising:
    operating the test equipment to control the transmission circuitry of the IC package to output the RF signaling; and
    operating the test equipment to capture the representations of the RF signaling received by the second launcher via the loop-back structure.

11. A method of operating the test jig of claim 1, the method comprising:
    operating transmission circuitry of the IC package to output RF signaling via the first launcher; and operating transmission circuitry of the IC package to capture a representation of the RF signaling received by the second launcher via the loop-back structure.

12. A method for testing an integrated circuit (IC) package integrating at least a first launcher and a second launcher by a first set of test equipment via a test jig, the method comprising:

performing a loop-back test by:
controlling transmitter circuitry of the IC package to output radio frequency (RF) signaling from the first launcher;
propagating the RF signaling to the second launcher via a propagation path of the test jig, the propagation path including a loop-back structure connected to the first launcher via a first air channel through a socket of the test jig and a second air channel in a printed circuit board (PCB) of the test jig that is aligned with the first air channel, and connected to the second launcher via a third air channel through the socket and a fourth air channel in the PCB that is aligned with the second air channel; and
controlling receiver circuitry of the IC package to process a representation of the propagated RF signaling received at the second launcher to generate test results.

13. The method of claim 12, further comprising:
receiving the test results from the IC package at the first set of test equipment; and
characterizing, at the first set of test equipment, an operational status of the IC package based on a comparison of the test results to a test characterization data set.

14. The method of claim 13, further comprising:
testing a plurality of instances of the IC package using the test jig and the first set of test equipment to generate a first data set;
testing the plurality of instances of the IC package using a different test jig and a second set of test equipment to generate a second data set; and
determining the test characterization data set based on identified correlations between the first data set and the second data set.

15. The method of claim 13, wherein receiving the test results comprises:
receiving signaling from the receiver circuitry at the first set of test equipment via the socket and at least one signal path in the PCB.

16. The method of claim 12, wherein controlling the transmitter circuitry comprises:
transmitting control signaling from the first set of test equipment to at least one contact of the IC package via the socket and at least one signal path in the PCB, wherein the transmitter circuitry is configured to output the RF signaling in response to the control signaling.

17. The method of claim 12, wherein the loop-back structure comprises a structure disposed on a side of the PCB opposite the socket, the structure comprising a first opening aligned with a facing opening of the second air channel in the PCB, a second opening aligned with a facing opening of the fourth air channel in the PCB, and one or more air channels extending between the first opening and the second opening.

18. The method of claim 12, wherein the loop-back structure comprises a structure disposed on a side of the PCB opposite the socket, the structure comprising a first opening aligned with a facing opening of the second air channel in the PCB, a second opening aligned with a facing opening of the fourth air channel in the PCB, and further comprises an RF attenuator mounted at a surface of the structure opposite the PCB, the RF attenuator having a third opening connected to the first opening via an air channel in the structure and a fourth opening connected to the second opening via a different air channel in the structure.

19. The method of claim 12, wherein the loop-back structure is integrated in the PCB using metallizations of the PCB and comprises at least one of: a substrate integrated waveguide (SIW); a micro-strip transmission line; or a strip-line.

20. An IC package tested using the method of claim 12.

* * * * *